(12) United States Patent
Fan et al.

(10) Patent No.: US 12,431,796 B2
(45) Date of Patent: Sep. 30, 2025

(54) FREQUENCY LOCK LOOP FOR CONSTANT SWITCHING FREQUENCY OF DC-DC CONVERTERS

(71) Applicant: Reed Semiconductor Corporation, Warwick, RI (US)

(72) Inventors: Jiwei Fan, Cary, NC (US); Yingqian Ma, Guangdong (CN); Jingyuan Chen, Guangdong (CN); Hal Chen, Short Hill, NJ (US); Jialun Du, Dublin, OH (US)

(73) Assignee: Reed Semiconductor Corporation, Warwick, RI (US)

( * ) Notice: Subject to any disclaimer, the term of this patent is extended or adjusted under 35 U.S.C. 154(b) by 0 days.

(21) Appl. No.: 17/305,543

(22) Filed: Jul. 9, 2021

(65) Prior Publication Data

US 2023/0010611 A1    Jan. 12, 2023

(51) Int. Cl.
*H02M 3/04* (2006.01)
*H02M 3/156* (2006.01)
*H03L 7/08* (2006.01)

(52) U.S. Cl.
CPC ........... *H02M 3/04* (2013.01); *H02M 3/1563* (2013.01); *H03L 7/08* (2013.01)

(58) Field of Classification Search
CPC ........ H02M 3/04; H02M 3/1563; H02M 1/44; H03L 7/08; Y02B 70/10
See application file for complete search history.

(56) References Cited

U.S. PATENT DOCUMENTS

| | | | |
|---|---|---|---|
| 9,270,176 B1 * | 2/2016 | Nguyen | H02M 3/156 |
| 10,924,010 B2 * | 2/2021 | Sun | H02M 3/156 |
| 10,965,215 B2 * | 3/2021 | Talari | H02M 3/1588 |
| 2009/0237060 A1 * | 9/2009 | Schiff | H02M 3/1563 |
| | | | 323/288 |
| 2011/0062932 A1 * | 3/2011 | Hawkes | H02M 3/156 |
| | | | 323/288 |
| 2011/0109398 A1 * | 5/2011 | Tang | H03K 7/08 |
| | | | 332/110 |
| 2011/0316502 A1 * | 12/2011 | Tang | H02M 3/156 |
| | | | 323/271 |
| 2017/0187279 A1 * | 6/2017 | Oe | H02M 1/4225 |
| 2017/0201175 A1 * | 7/2017 | Chen | H02M 3/156 |
| 2021/0028701 A1 * | 1/2021 | Dharmalinggam | H02M 1/08 |

* cited by examiner

*Primary Examiner* — Emily P Pham
(74) *Attorney, Agent, or Firm* — AP3 Law Firm PLLC

(57) ABSTRACT

A frequency lock loop for a constant switching frequency of DC-DC converter, wherein the frequency lock loop includes a modulation circuit to generate a modulation signal in response to an input signal of the DC-DC converter and a frequency signal. Wherein a timer of the DC-DC converter generates a timing signal in response to the input signal, and wherein the frequency signal is a function of the timing signal.

16 Claims, 3 Drawing Sheets

FREQUENCY LOCK LOOP FOR CONSTANT SWITCHING FREQUENCY OF DC-DC CONVERTERS

BACKGROUND OF THE INVENTION

The present invention relates to switching power supplies and, more particularly, a frequency lock loop for constant switching frequency of DC-DC converters.

DC-DC converters play a vital role in efficient power management in various portable devices. However, DC-DC converters are made of non-ideal components and/or arrangements that suffer from parasitic losses and inefficiencies. Accordingly, DC-DC converter components must be carefully specified and physically arranged to achieve stable operation and to keep switching noise (EMI/RFI) at acceptable levels.

One type of DC-DC converter uses constant on-time or constant off-time schemes to control output, and so strives for a constant final switching frequency through different system conditions by regulating/removing a plurality of variable systemic switching frequencies. The switching frequency (FSW) of DC-DC converters can change more than 20% with different Input Voltage (VIN), Output Voltage (VOUT)) and Load Current. When the nominal switching frequency is higher than 2MHz, the variation can be as large as 40%. The switching frequency change can make power system design challenging and suboptimal, since the output capacitor, power inductor and EMI design are a function of the DC-DC converter's switching frequency.

Adjusting the TON/TOFF based on the VIN, VOUT, ILOAD information, however, is not sufficient nor accurate for common DC-DC converter applications as there are still many variables, like the comparator delay, dead time of the power stage, loss of the power stages, etc., can affect the FSW.

Current methods of regulating switching frequency rely on feed forward information from VIN, VOUT, SW node voltage, etc. A control system which has only feed-forward behavior responds to its control signal in a pre-defined way without responding to how the load reacts. Accordingly, the circuit implementations of these feed forward scheme are complicated, and these feed forward schemes cannot regulate all the variables in a DC-DC converter system which can cause switching frequency modulation.

Moreover, the errors introduced by the feed forward circuits themselves can also bring new FSW variations. For example, feed forward circuits adjusting the TON/TOFF have their own accuracy and non-linearity problems. As a result, while feed forward circuits remove some FSW variation, they also create some new FSW variations. In sum, previous methods cannot optimally remove or regulate the FSW variations.

Turning now to current constant on/off time generator (TON/TOFF generator). designs. Specifically, the TON/TOFF time signal is generated by comparing a Ramp voltage, which is related to VIN and the threshold voltage (Vth), wherein Vth is related to VOUT (for TON) or VIN-VOUT (for TOFF). But generating the TON/TOFF only according to VIN and VOUT information is not enough to keep the final FSW of the DC-DC converter constant through different system conditions. The nonlinearity of Ramp, offset and delay of TON/TOFF comparator, Load change, dead time change, etc. however can all negatively affect the stability of FSW. Previous methods added many circuits to estimate and compensate each of these errors.

As can be seen, there is a need for a frequency lock loop for a constant switching frequency of DC-DC converters utilizing a TON/TOFF generator. The present invention uses a feedback scheme, loop, or path that employs a feedback signal of the FSW that regulates or accounts for all of the systemic variables which induce the FSW changes through adjusting the TON/TOFF width of the TON/TOFF generator, thereby eliminating of the complexity and only feedback the FSW information and adjust.

Specifically, a Frequency Lock Loop (FLL) is added to the constant TON/TOFF generator, wherein the FLL senses the real time switching activities of the DC-DC converters and changes the final switching frequency (FSW) accordingly. In certain embodiments the FSW is changed to a voltage/modulation signal ($V_{FSW}$) using a modulation circuit and/or a sample and hold circuitry. This switching frequency related voltage signal $V_{FSW}$ will be sent back to the comparator in the TON/TOFF generator together with a reference voltage. With this FLL added, when the FSW is different from a target frequency (reference voltage), the FLL will help to adjust the TON/TOFF width and brings the FSW back to the target frequency.

As a result, the present invention does not need to cover all of the systemic switching frequency variables with complicated circuits. By only feedbacking the switching frequency and adjusting the TON/TOFF comparator, the FSW of DC-DC converter is well controlled. Moreover, the final FSW stability is also much better without the new error introduced by the feedforward circuits.

SUMMARY OF THE INVENTION

In one aspect of the present invention, a switching power supply controller includes the following: a modulation circuit to generate a modulation signal in response to an input signal and a frequency signal; and a timer to generate a timing signal in response to the input signal, wherein the frequency signal is a function of the timing signal.

In another aspect of the present invention, the switching power supply controller may include wherein a timer input of the timer references a reference voltage and the modulation signal; and further including a comparator operatively associated with the input signal and a threshold voltage, wherein an output of the comparator is connected to said timer input, wherein the modulation circuit and the comparator comprise a frequency feedback loop operatively associated with said timer input, and wherein the timer is a constant on/off time generator.

In yet another aspect of the present invention, a method of removing variable switching frequencies from a direct current to direct current (DC-DC) converter utilizing a constant on/off time generator, the method including operatively associating the frequency feedback loop of the above-mentioned switching power supply controller with the comparator operatively having two input ports associated with the input signal and a threshold voltage, respectively, and wherein an output port of the comparator is electrically coupled to the above-mentioned timer.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Broadly, an embodiment of the present invention provides a frequency lock loop for a constant switching frequency of DC-DC converter, wherein the frequency lock loop includes a modulation circuit to generate a modulation signal in response to an input signal of the DC-DC converter and a frequency signal. Wherein a timer of the DC-DC converter generates a timing signal in response to the input signal, and wherein the frequency signal is a function of the timing signal.

Figure 1:
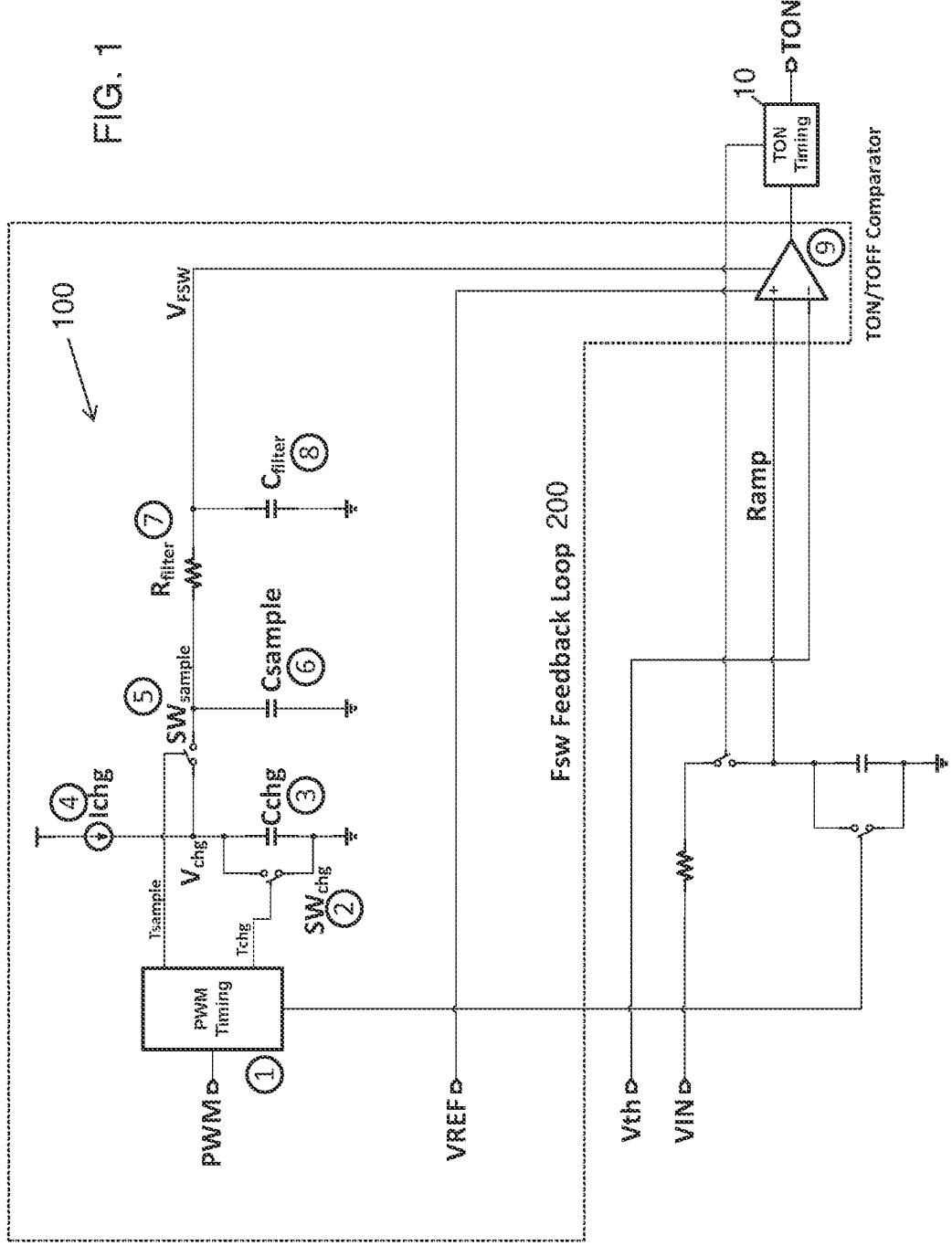
FIG. 1 is a schematic view of an exemplary embodiment a feedback loop of the present invention.
Figure 2:
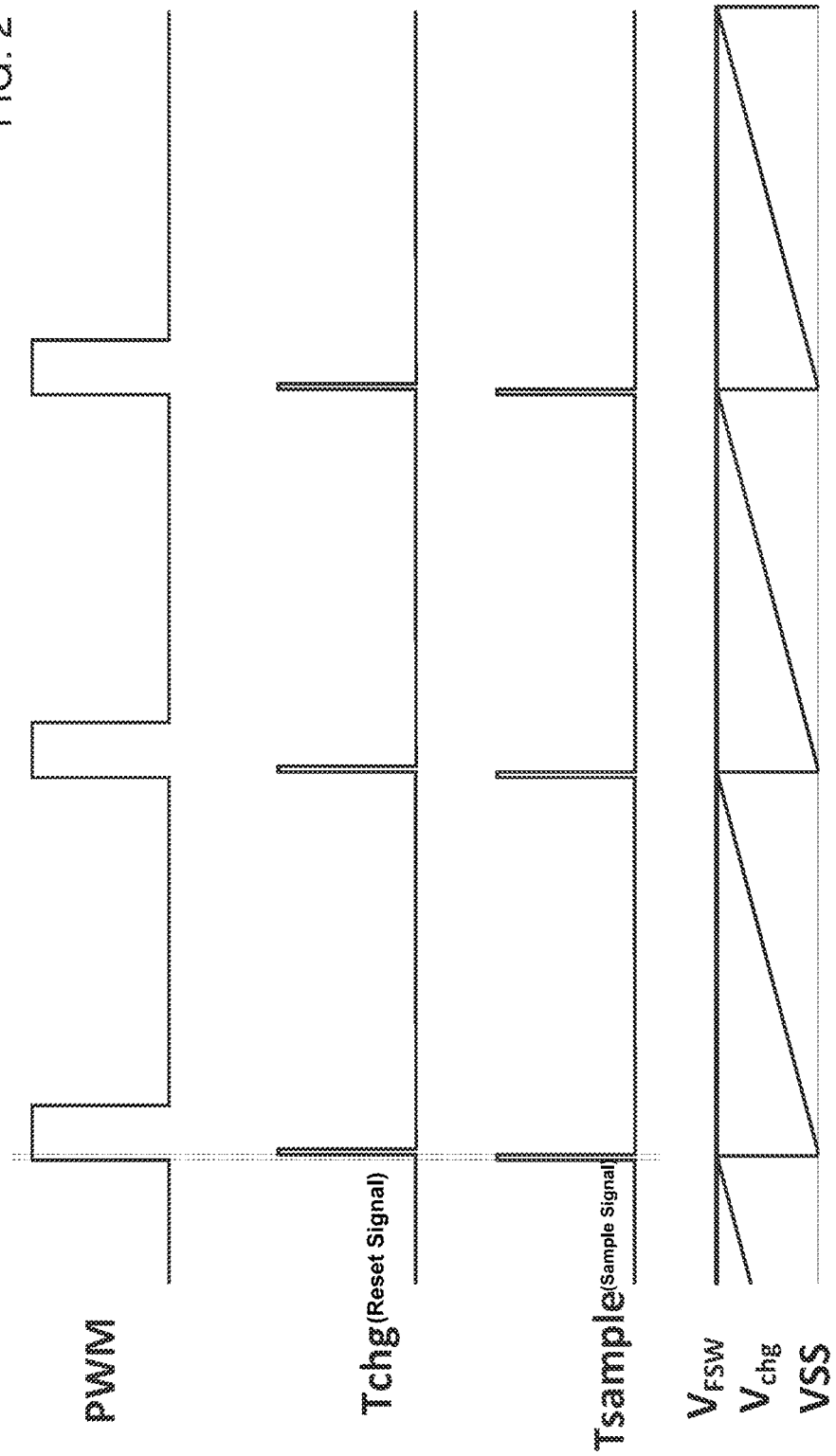
FIG. 2 illustrates example waveforms of signals that may be obtained with the exemplary disclosed system of the present invention.
Figure 3:
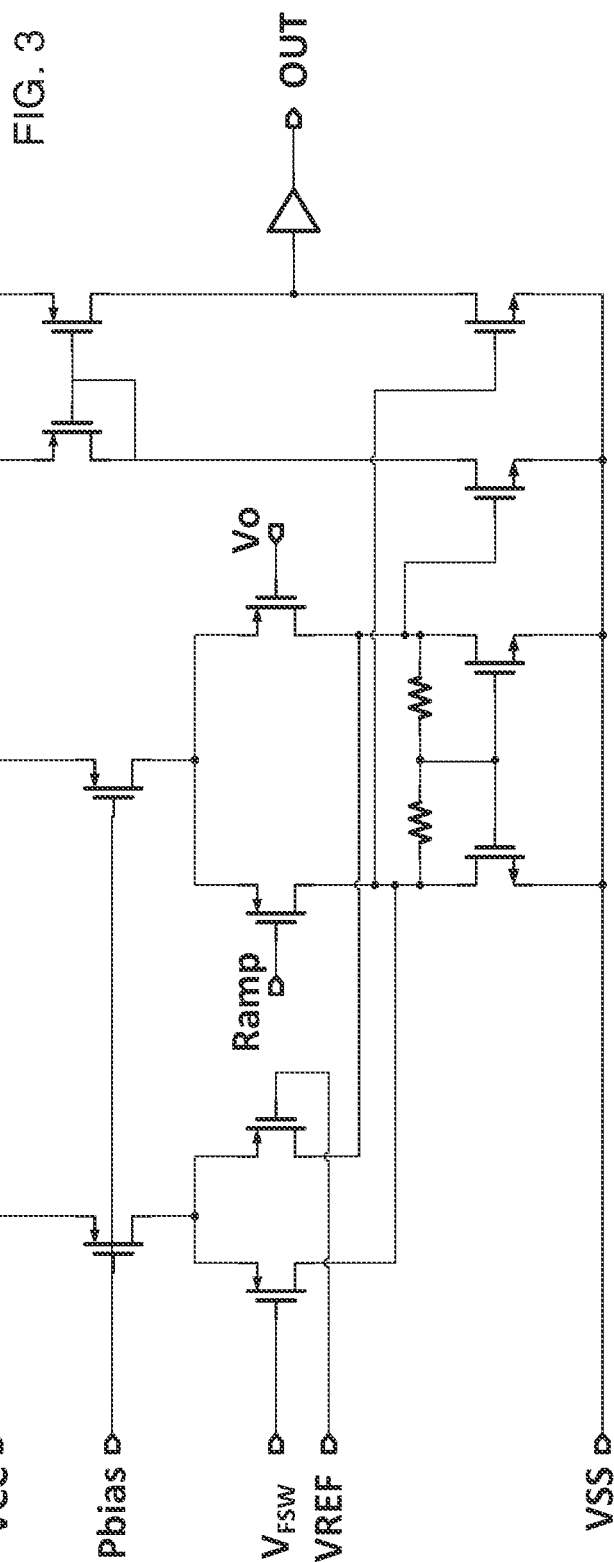
FIG. 3 is a schematic view of an exemplary embodiment of a TON/TOFF comparator of the present invention.

Referring now to FIGS. 1 through 3, the present invention may include a

DC-DC converter using constant on-time or constant off-time schemes having modulating or variable switching frequencies, wherein a timing circuit embodying control signals of a pulse-width modulation (PWM) is used to control the output of the power supplied by way of the DC-DC converter. This PWM timing circuitry may be configured to sense the switching frequency from a modulation circuit 100 input signal and generate a timing signal in response to the input signal in such a way that a frequency lock loop so that the switching frequency is affected so that the modulation circuit 100 output signal ($V_{FSW}$) has the voltage level proportional to the reciprocal of the DC-DC converter's switching frequency, FSW.

Referring to FIG. 1, in certain embodiments, the modulation circuit 100 may include a PWM timing block 1 generating timing signals comprising a Tsample and a Tchg, wherein Tchg is used to control the charging and discharging of a capacitor, Cchg 3, and wherein the Tsample is used to sample the peak voltage on the top terminal of Cchg 3. The modulation circuit 100 may further include a switch, SWchg 2, adapted to control the charge and discharge of the Cchg 3. The capacitor, Cchg 3, may be charged by Ichg when SWchg 2 is open. The modulation circuit 100 may further include a current source, Ichg, which is used to charge Cchg 3.

The modulation circuit 100 may further include the following: a switch, SWsample 5, which will be close at the peak of the charging voltage on Cchg 3; a capacitor, Csample 6, which will sample the peak voltage of Cchg 3; a resistor, Rfilter 7 operatively associated with a capacitor, Cfilter, 8 in such a way as to be configured as a low pass filter Rfilter-Cfilter.

The constant on-time or constant off-time schemes may be implemented by a TON/TOFF generator 10 having an input element operatively associated with a TON/TOFF comparator 9 configured to compare a Ramp voltage, which is related to VIN and the threshold voltage (Vth).

The present invention may be adapted to define a target frequency by way of generating a selectable reference voltage $V_{REF}$ or to a voltage value related to the reference voltage $V_{REF}$.

The TON/TOFF comparator 9 may configured (or may be reconfigured for methods of improving a pre-existing DC-DC converter using constant on-time or constant off-time schemes) in such a way that the TON/TOFF comparator 9 can adjust its input offset according to the difference between $V_{REF}$ and $V_{FSW}$.

In certain embodiments, a FSW Feedback Loop/Path or Frequency Lock Loop (FLL) may be operatively associated with the TON/TOFF comparator 9 so that the switching frequency (FSW) is affected by the TON/TOFF width generated by the TON/TOFF generator 10.

For constant TON control scheme, the FSW is determined by the following equation (ignore other small variables): FSW=VOUT/(VIN×TON). For TOFF control, FSW is determined by: FSW=(VIN−VOUT)/(VIN×TOFF).

Again, the FSW may be sensed by the PWM control signal, wherein the PWM timing block 1 generates the Tchg timing signal to control the charging/discharging of Cchg 3. The sample circuit samples the peak voltage of Vchg and holds it with Csample 6. The Low pass filter Rfilter+Cfilter helps to compensate the FSW feedback loop and filter out the sampling noise. After the filter, $V_{FSW}$ and $V_{REF}$ are sent to TON/TOFF comparator 9 to adjust the TON/TOFF time.

One of the possible implementations of the TON/TOFF comparator 9 is shown in the FIG. 3. Using constant TON Buck Converter as an example, when the FSW is higher than the target frequency, the $V_{FSW}$ will be lower than $V_{REF}$. The voltage difference between $V_{FSW}$ and $V_{REF}$ will make the TON width larger and the final FSW will be lowered to the target frequency. If the FSW is lower than the target frequency, the difference between $V_{FSW}$ and $V_{REF}$ will make the TON width smaller and make the FSW faster. If the feedback gain is high enough, any FSW variation will be corrected by this FSW feedback loop.

The control circuit disclosed herein may be an integrated silicon chip or build it on PCB using discrete components. Adding some circuitry for FSW frequency selection and trimming of the Ichg may make the control circuit more accurate and support more frequency options.

To use the present invention, one need adds the new FSW Feedback Loop/FLL 200 to a TON/TOFF generator 10 in the constant time DC-DC converter. The present invention can be utilized to create a DC-DC Buck Converter, a DC-DC Boost Converter, and/or a DC-DC Buck-Boost Converter.

It should be understood, of course, that the foregoing relates to exemplary embodiments of the invention and that modifications may be made without departing from the spirit and scope of the invention as set forth in the following claims.

What is claimed is:

1. A switching power supply controller comprising:
   a PWM timing circuit configured to generate a sample signal and a reset signal, wherein a leading edge of the sample signal occurs earlier than a leading edge of the reset signal;
   a frequency detection capacitor configured to be charged by a current source, wherein a voltage across the frequency detection capacitor is reset by the reset signal;
   a sample and hold circuit configured to detect a peak voltage across the frequency detection capacitor;
   a comparator configured to receive a ramp signal, a threshold voltage signal, the peak voltage and a predetermined reference, wherein a difference between the peak voltage and the predetermined reference is configured to adjust a comparison result between the ramp signal and the threshold voltage signal; and a timer configured to generate a timing signal based on the comparison result.

2. The switching power supply controller of claim 1, wherein:

the sample signal is configured to control a sample switch, and wherein the sample switch is connected between a common node of the current source and the frequency detection capacitor, and the sample and hold circuit.

3. The switching power supply controller of claim 1, further comprising:

a filter coupled to an output of the sample and hold circuit, wherein the peak voltage is tapped at an output of the filter.

4. The switching power supply controller of claim 3, wherein:

the PWM timing circuit, the sample and hold circuit, the current source, the frequency detection capacitor, the filter and the comparator form a frequency feedback loop operatively associated with the timer.

5. The switching power supply controller of claim 1, wherein:

the timer is a constant on/off time generator.

6. The switching power supply controller of claim 1, wherein:

the ramp signal is generator by a ramp generator.

7. The switching power supply controller of claim 6, wherein:

the ramp generator comprises a resistor, a first switch, a ramp capacitor and a second switch, and wherein:

the resistor, the first switch and the ramp capacitor area connected in series between an input voltage bus and ground; and the second switch is connected in parallel with the ramp capacitor.

8. The switching power supply controller of claim 7, wherein:

the ramp signal is tapped at a common node of the first switch and the ramp capacitor.

9. The switching power supply controller of claim 1, wherein:

the comparator comprises a first input, a second input, a third input, a fourth input and an output, and wherein:

the first input is configured to receive the peak voltage;

the second input is configured to receive the predetermined reference;

the third input is configured to receive the ramp signal;

the fourth input is configured to receive the threshold voltage signal; and the output is configured to generate the comparison result fed into the timer.

10. The switching power supply controller of claim 1, wherein:

a falling edge of the sample signal is aligned with the leading edge of the reset signal.

11. A method of removing variable switching frequencies from a direct current to direct current (DC-DC) converter utilizing a constant on/off time generator, the method comprising:

charging a frequency detection capacitor by a current source, wherein a voltage across the frequency detection capacitor is reset by a reset signal;

in response to a sample signal, sampling a peak voltage across the frequency detection capacitor, wherein a leading edge of the sample signal occurs earlier than a leading edge of the reset signal;

comparing the peak voltage with a predetermined reference;

converting a voltage difference between the peak voltage with the predetermined reference into a current difference; and adjusting a comparison result between a ramp signal and a threshold voltage signal based on the current difference.

12. The method of claim 11, further comprising:
feeding the comparison result into a timer.

13. The method of claim 12, wherein:
the timer is the constant on/off time generator.

14. The method of claim 11, wherein:
the peak voltage is proportional to a switching frequency of a pulse-width modulation signal.

15. The method of claim 14, further comprising:

in response to an operating condition where the switching frequency is higher than a target frequency, configuring the voltage difference between peak voltage with the predetermined reference to increase an on-time of the pulse-width modulation signal so as to lower the switching frequency.

16. The method of claim 14, further comprising:

in response to an operating condition where the switching frequency is lower than a target frequency, configuring the voltage difference between peak voltage with the predetermined reference to reduce an on-time of the pulse-width modulation signal so as to increase the switching frequency.

* * * * *